(12) United States Patent
Lang

(10) Patent No.: US 9,134,379 B2
(45) Date of Patent: Sep. 15, 2015

(54) METHOD FOR TESTING THE PERFORMANCE OF A VACUUM SWITCH OF A TRACTION CONVERTER

(75) Inventor: Norbert Lang, Fürth (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 572 days.

(21) Appl. No.: 13/389,752

(22) PCT Filed: Aug. 5, 2010

(86) PCT No.: PCT/EP2010/061395
§ 371 (c)(1),
(2), (4) Date: Feb. 9, 2012

(87) PCT Pub. No.: WO2011/018405
PCT Pub. Date: Feb. 17, 2011

(65) Prior Publication Data
US 2012/0140536 A1    Jun. 7, 2012

(30) Foreign Application Priority Data

Aug. 10, 2009  (EP) ..................... 09167530

(51) Int. Cl.
*H01H 33/66* (2006.01)
*G01R 31/327* (2006.01)
(Continued)

(52) U.S. Cl.
CPC ........... *G01R 31/3275* (2013.01); *B60L 3/0023* (2013.01); *B60L 9/00* (2013.01);
(Continued)

(58) Field of Classification Search
CPC ........... B60L 3/00; B60L 9/24; H02M 7/483; H02M 7/48; H02M 7/53; H02P 7/63
USPC ........... 363/34, 35, 37, 51–53, 124; 323/254, 323/263, 291, 293
See application file for complete search history.

(56) References Cited

U.S. PATENT DOCUMENTS

| 4,467,408 A * | 8/1984 | Matulevich et al. ............ 363/54 |
| 6,538,412 B1 * | 3/2003 | Klose et al. ................... 318/801 |
| 2004/0252533 A1 * | 12/2004 | Eguchi ............................ 363/97 |

FOREIGN PATENT DOCUMENTS

| GB | 2203559 A | 10/1988 |
| JP | 8308252 A | 11/1996 |

OTHER PUBLICATIONS

M. M. Bakran, H.-G. Eckel, P. Eckert, H. Gambach, U. Wenkemann; Comparison of Multi-System Traction Converters for High-Power Locomotives; PESC Konferenz 2004, Aachen 21,—Jun. 23, 2004; Aachen; Others; 2004; DE.
(Continued)

*Primary Examiner* — Jessica Han
*Assistant Examiner* — Gustavo Rosario Benitez
(74) *Attorney, Agent, or Firm* — Henry M. Feiereisen LLC.

(57) ABSTRACT

A method for functionally checking a vacuum switch of a traction inverter having a grid-side four-quadrant chopper and a load-side pulse inverter electrically connected in parallel on the DC side by a DC intermediate circuit. The AC side of the chopper is connected to a secondary winding of a traction transformer, with the primary winding of the traction transformer connectable to an AC grid voltage by a vacuum switch. When the vacuum switch is open, the chopper is actuated precisely when the AC grid voltage is temporally located relative to the chopper input voltage, such that the amplitude of a voltage difference between the AC grid voltage and the chopper input voltage corresponds to a predetermined test voltage. It is then checked whether current flows from the AC supply grid to the chopper. The functionality of the vacuum switch can thus be checked at any time without a test device.

5 Claims, 3 Drawing Sheets

(51) Int. Cl.
*B60L 3/00* (2006.01)
*B60L 9/00* (2006.01)
*H01H 33/668* (2006.01)
*G01R 31/00* (2006.01)
*G01R 31/42* (2006.01)

(52) U.S. Cl.
CPC ......... *H01H 33/668* (2013.01); *B60L 2200/26* (2013.01); *G01R 31/008* (2013.01); *G01R 31/42* (2013.01); *H01H 33/66* (2013.01)

(56) References Cited

OTHER PUBLICATIONS

Sonderdruck aus Elektrischen Bahnen, Jahrgang 45, Heft 6, 1974; Others; 1974; DE.

* cited by examiner

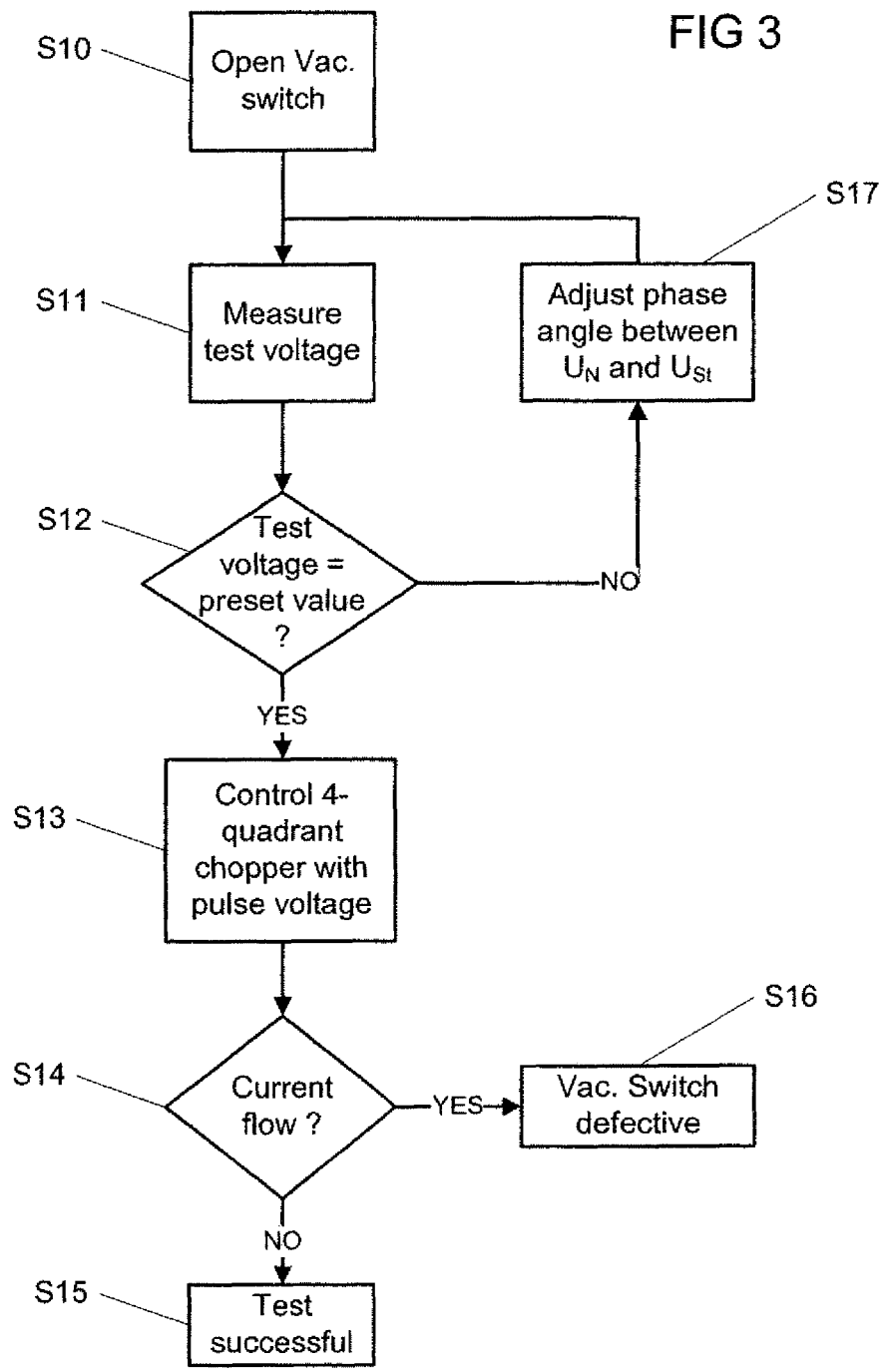

METHOD FOR TESTING THE PERFORMANCE OF A VACUUM SWITCH OF A TRACTION CONVERTER

CROSS-REFERENCES TO RELATED APPLICATIONS

This application is the U.S. National Stage of International Application No. PCT/EP2010/061395, filed Aug. 5, 2010, which designated the United States and has been published as International Publication No. WO 2011/018405 and which claims the priority of European Patent Application, Serial No. 09167530.6, filed Aug. 10, 2009, pursuant to 35 U.S.C. 119(a)-(d).

BACKGROUND OF THE INVENTION

The invention relates to a method for functionally checking a vacuum switch of a traction converter.

A traction converter of said type is illustrated in more detail in FIG. 1. Said traction converter has a four-quadrant chopper 2 on the AC supply side and a self-commutated converter 4, which is also referred to as a pulse-controlled converter, on the load side which are electrically connected in parallel on the DC voltage side by means of an intermediate circuit capacitor $C_{ZK}$. A three-phase AC motor 6 is connected at the outputs of the pulse-controlled converter 4. On the AC voltage side the four-quadrant chopper 2 can be connected in an electrically conductive manner to a contact wire 14 by means of a secondary winding 8 of a traction transformer 10 and a vacuum switch 12. One terminal of the secondary winding 8 of the traction transformer 10 in each case is connected in an electrically conductive manner to an AC voltage terminal 16 or 18 of the four-quadrant chopper 2. A single-phase AC supply voltage $u_N$ is converted by means of said four-quadrant chopper 2 into a predetermined intermediate circuit DC voltage $U_{ZK}$, from which a voltage system adapted to the needs of the three-phase AC motor 6, for example a three-phase voltage system of variable amplitude and frequency, is generated.

In said known embodiment variant of the traction converter, deactivatable power semiconductor switches, in particular Insulated Gate Bipolar Transistors (IGBTs), are used in each case as converter valves T1 to T6 of the self-commutated converter 4 and as converters T7 to T10 of the four-quadrant chopper 2. A power diode D1 to D6 or D7 to D10 is electrically connected in parallel with each deactivatable power semiconductor switch T1 to T6 or T7 to T10, respectively.

The power flow direction relevant to the converter configuration is from the feeding network by way of the contact wire 14 and the traction transformer 10, the four-quadrant chopper 2 and the self-commutated converter 4, to the three-phase AC motor 6. A feedback control device 20, to which the single-phase AC supply voltage $u_N$ is fed, is provided for controlling the converter valves T7 to T10 of the four-quadrant chopper 2. A microcontroller accommodated in the open- and closed-loop control device of the traction converter can be provided for example as the feedback control device 20.

A traction converter as illustrated in FIG. 1 is known from the publication titled "Comparison of Multi-System Traction Converters for High-Power Locomotives" PESC Conference 2004 from Jun. 21 to Jun. 23, 2004 in Aachen, in particular from FIG. 10 of said publication. If importance is attached to a low harmonic factor of the AC line current on the AC supply side, two four-quadrant choppers are provided on the AC supply side, each of which is connected in parallel on the AC supply side via a transformer secondary winding and operates on a common DC voltage intermediate circuit. Said two four-quadrant choppers are controlled by means of phase-shifted clocking of the two four-quadrant choppers. What is achieved thereby is that the harmonic components of the AC supply currents on the secondary side are electrically shifted relative to one another through 180° on the secondary side and consequently largely compensate one another on the primary side of the traction transformer through summation. A traction converter of said type is also known from the above-cited publication, in particular from FIG. 8 or FIG. 12 of said publication.

The vacuum switch 12 is a power switch 12 that is dimensioned for high currents. Said switch is able not only to switch on operating currents, but also to hold and switch off high overload currents and short-circuit currents for a predefined time in the event of faults. The contacts of the vacuum switch are contained in a vacuum in order to avoid arcing. Said vacuum switches are mainly used only in medium voltage installations having voltages up to approx. 40 kV and are suitable for very great switching frequencies while being virtually maintenance-free. Said vacuum switch can lose its functional capability as a result of spontaneous or gradual loss of the vacuum. In the event of a fault the entire traction converter can be affected as a result of a vacuum switch becoming inoperable in such a way.

It is well-known to use a test device in order to enable the functional integrity of a vacuum switch of said type to be checked. For this purpose the vacuum switch of the traction converter must be separated from the high-voltage equipment and the test device connected. Known test devices operate with a test voltage of several kilovolts and must be equipped with a high-voltage transformer and correspondingly dimensioned insulation. It is also necessary to observe extensive precautionary measures during the testing itself. The operating principle of the known test instrument provides that the vacuum chamber is tested with a test voltage lying between the breakdown voltage at full vacuum and the breakdown voltage of air at atmospheric pressure. Said test voltage is applied to the open switching contacts and the internal breakdown voltage is determined. In this way it is established whether the tested vacuum chamber still possesses a sufficient vacuum.

This testing of the vacuum switch represents investment of resources and downtimes of the traction drive. If the testing is not carried out, failure of the vacuum switch can result in high consequential damage. Since a test device has to be used for functionally checking the vacuum switch, said functional check can only be carried out in a railroad or streetcar depot.

The object underlying the invention is thus to disclose a method for functionally checking the vacuum switch of a traction converter, as a result of which the use of a test device can be dispensed with.

SUMMARY OF THE INVENTION

This object is achieved according to the invention by a method for functionally checking a vacuum switch of a traction converter having at least one AC supply-side four-quadrant chopper with AC voltage-side terminals connected to a secondary winding of a traction transformer and a load-side pulse-controlled converter, with the DC voltage side of the four-quadrant chopper and of the pulse-controlled converter being electrically connected in parallel with an intermediate circuit capacitor, and with a vacuum switch configured to connect a primary winding of the traction transformer with an AC supply voltage from a supply grid. The method includes driving the four-quadrant chopper, when the vacuum switch is open, precisely at a time when an amplitude of a voltage difference between a measured AC supply voltage and a chopper input voltage corresponds to a predetermined test voltage, and checking whether a current is flowing from the supply grid to the four-quadrant chopper.

The method according to the invention consists in controlling the four-quadrant chopper in such a way with the vacuum switch open that the chopper generates, as the chopper voltage, a voltage pulse whose timing relative to the rotational AC supply voltage is set such that a predetermined test voltage drops at the vacuum switch. If the insulation capability of the vacuum switch is not given, a current flows from the feeding network to the four-quadrant chopper, which current is measured by a measured value acquisition entity of the four-quadrant chopper. If the vacuum switch is functioning correctly, no current flow can be detected. A voltage pulse of said kind is generated using the energy of the intermediate circuit capacitor of the voltage intermediate circuit of the traction converter.

The advantage of the method according to the invention for functionally checking a vacuum switch of a traction converter resides in the fact that there is no longer any need to use a test device. In other words the functional check can be carried out using the available circuitry components of a traction converter. A further advantage is that it is no longer necessary to separate the vacuum switch from the high-voltage equipment. Said functional check of the vacuum switch of a traction converter can therefore be carried out anywhere and at any time. The functional check can be executed automatically. Fault detection is simplified and improved significantly on account of the low outlay involved in the functional checking of the vacuum switch of a traction converter.

BRIEF DESCRIPTION OF THE DRAWING

For a more detailed explanation of the invention reference is made to the drawing, with the aid of which the principle of operation of the inventive method is expounded in greater depth.

FIG. 1 shows a known embodiment variant of a traction converter, while

FIG. 3 shows schematic flow diagram of the method according to the present invention.

DETAILED DESCRIPTION OF PREFERRED EMBODIMENTS

Figure 1:
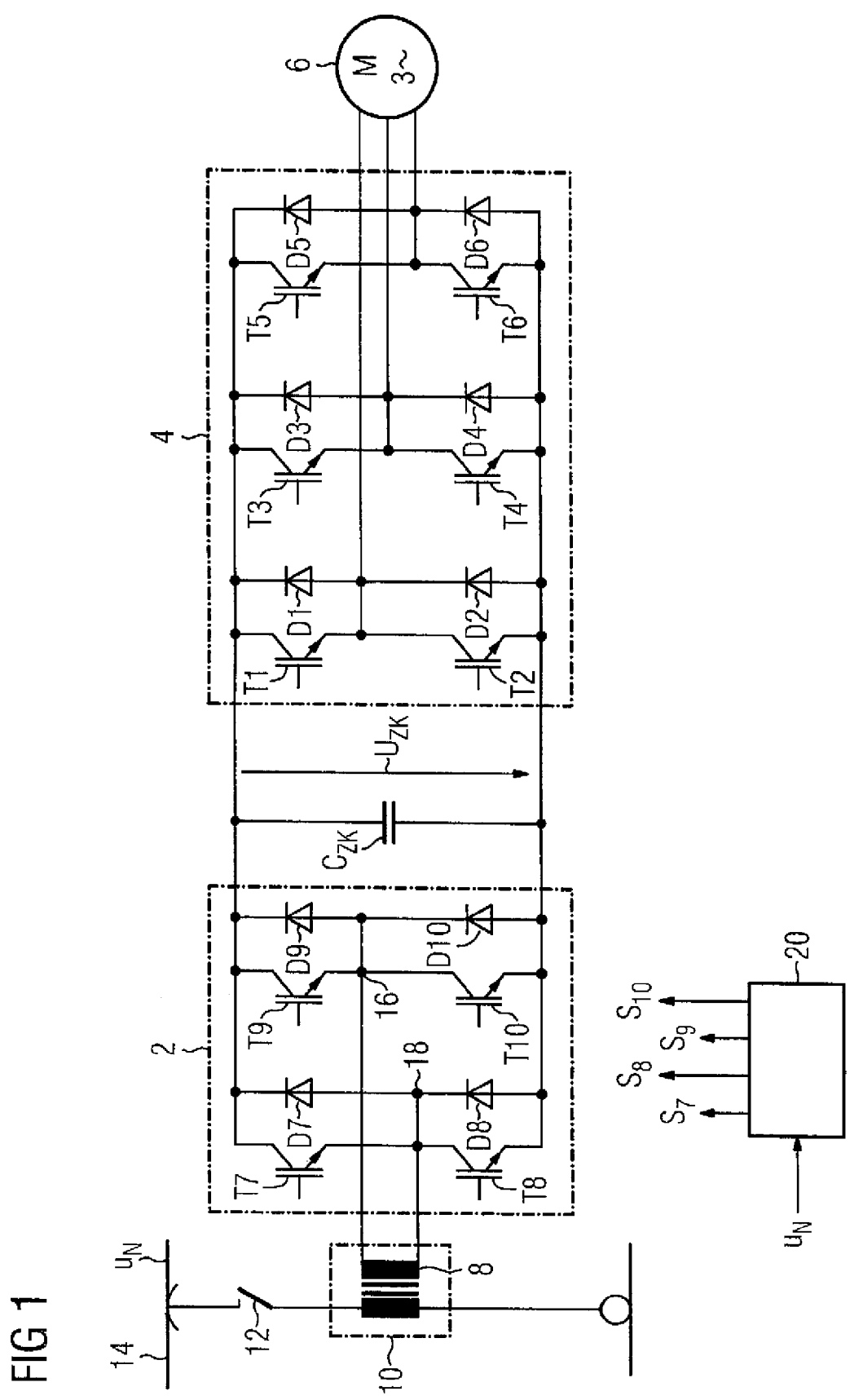

Said single-phase equivalent circuit diagram has a voltage source 22 and a voltage source 24 which are electrically connected in parallel. The voltage source 22 replaces the feeding network, the voltage source 24 representing a substitute for the four-quadrant chopper 2 with DC voltage-side intermediate circuit capacitor $C_{ZK}$. Of the traction transformer 10, only its leakage inductor 26 appears in the single-phase equivalent circuit diagram. The open vacuum switch 12 is represented in the equivalent circuit diagram as a spark gap 28. During the operation of the traction converter the vacuum switch 12 is closed, with the result that the two voltage sources 22 and 24 are electrically connected in parallel by means of the leakage inductor of the traction transformer 10. According to this equivalent circuit diagram, AC supply voltage $\underline{u}_N$ and chopper input voltage $\underline{u}_{St}$ are phase-shifted by an angle relative to one another during normal operation. The inductance may become lower as the chopper clock rate increases. The angle between AC supply voltage $\underline{u}_N$ and chopper voltage $\underline{u}_{St}$ also becomes smaller as a result. A corresponding vector diagram is shown in the publication titled "Vierquadrantensteller—eine netzfreundliche Einspeisung für Triebfahrzeuge mit Drehstromantrieb" ("Four-quadrant chopper—a power-grid-friendly supply for traction vehicles with three-phase drive"), reprint from the German periodical "Elektrische Bahnen", Volume 45, Issue 6, 1974, in particular in FIG. 10 of said reprint.

Figure 2:
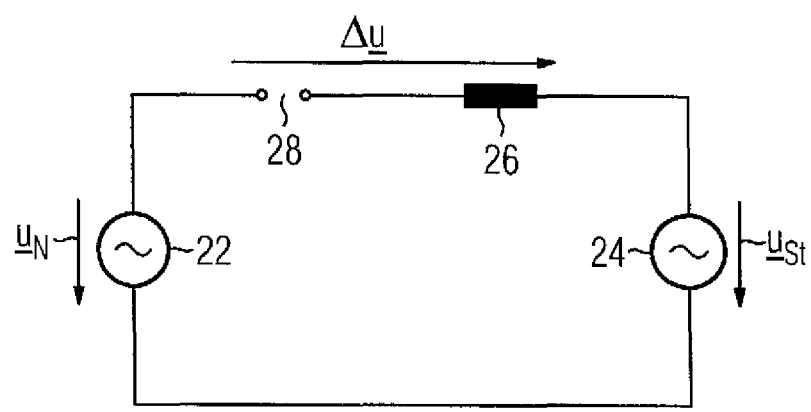
FIG. 2 shows an associated single-phase equivalent circuit diagram for supply-side voltages and currents.

As illustrated in the schematic flow diagram of FIG. 3, in the inventive methods for testing the operation of the vacuum switch 12 of a traction converter, the two contacts of the vacuum switch 12 are in the open state, step S10. In other words said two contacts are arranged spaced apart from each other in the vacuum chamber of the vacuum switch 12. For this reason said vacuum switch 12 is represented as a spark gap 28 in the single-phase equivalent circuit diagram according to FIG. 2. The test voltage for the vacuum switch 12 which corresponds to the differential voltage $\Delta u$ between AC supply voltage $\underline{u}_N$ and chopper input voltage $\underline{u}_{St}$, is then measured, step S11. In order to be able to test the functional capability of the vacuum switch 12, said differential voltage $\Delta \underline{u}$ must reach a predetermined breakdown voltage value, step S12. The amplitude of the differential voltage $\Delta \underline{u}$ can be adjusted by means of the timing (phase angle) of the chopper input voltage $\underline{u}_{St}$ relative to the AC supply voltage $\underline{u}_N$, step S17. In other words the angle between the AC supply voltage $\underline{u}_N$ and the chopper input voltage $\underline{u}_{St}$ must reach a predetermined value. If the AC supply voltage $\underline{u}_N$ is disposed relative in time to the chopper input voltage $\underline{u}_{St}$ such that the differential voltage $\Delta \underline{u}$ reaches the amplitude of a predetermined test voltage, the four-quadrant chopper 2 is driven in such a way that a voltage pulse is present as the chopper input voltage $\underline{u}_{St}$, step S13. Said voltage pulse is dimensioned in terms of time such that the traction transformer 10 does not go into saturation. A check is then carried out to determine whether a current is flowing from the feeding network to the four-quadrant chopper 2, step S14. This check is performed by means of the measured value acquisition entity of the four-quadrant chopper 2. If no flowing current can be measured, the vacuum switch 12 has successfully passed its functional check, step 15. If, on the other hand, a flowing current can be detected, the vacuum switch is defective and must be replaced, step 16.

By means of this inventive method it is possible to test the functional capability of the vacuum switch of a traction converter at any time and anywhere, with no further requirement for a test device.

What is claimed is:

1. A method for testing a performance of a vacuum switch of a traction converter having at least one AC supply-side four-quadrant chopper with AC voltage-side terminals connected to a secondary winding of a traction transformer and a load-side pulse-controlled converter, with a DC voltage side of the four-quadrant chopper and of the pulse-controlled converter being electrically connected in parallel with an intermediate circuit capacitor, and with the vacuum switch configured to connect a primary winding of the traction transformer with an AC supply voltage from a supply grid, the method comprising:

opening the vacuum switch to disconnect the AC supply voltage from the primary winding of the traction transformer, controlling the four-quadrant chopper to supply at the input of the four-quadrant chopper a voltage pulse with a phase angle relative to the AC supply voltage, said voltage pulse producing a test voltage across the open vacuum switch that is equal to a predetermined value of a breakdown voltage of the vacuum switch, and checking whether the test voltage causes a current flow from the supply grid to the four-quadrant chopper across the open vacuum switch, wherein the vacuum switch operates normally when no current flow from the supply grid to the four-quadrant chopper across the open vacuum switch is detected, and wherein the vacuum switch is defective when a current flow from the supply grid to the four-quadrant chopper across the open vacuum switch is detected.

2. The method of claim 1, wherein the voltage pulse is generated from energy stored in the intermediate circuit capacitor.

3. The method of claim 1, wherein an amplitude of the chopper input voltage is adjustable.

4. The method of claim 3, wherein the phase angle of the chopper input voltage relative to the AC supply voltage is adjustable.

5. The method of claim 1, wherein a duration of the voltage pulse is selected so as to prevent saturation of the traction transformer.

* * * * *